US006929996B2

(12) United States Patent
Hao et al.

(10) Patent No.: US 6,929,996 B2
(45) Date of Patent: Aug. 16, 2005

(54) CORNER ROUNDING PROCESS FOR PARTIAL VERTICAL TRANSISTOR

(75) Inventors: Chung-Peng Hao, Taipei Hsien (TW); Yi-Nan Chen, Taipei (TW); Ming-Cheng Chang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 50 days.

(21) Appl. No.: 10/726,434

(22) Filed: Dec. 3, 2003

(65) Prior Publication Data

US 2005/0042819 A1 Feb. 24, 2005

(30) Foreign Application Priority Data

Aug. 19, 2003 (TW) .......................................... 92122719 A

(51) Int. Cl.[7] ................. H01L 21/8234; H01L 21/8244; H01L 21/8242

(52) U.S. Cl. ....................... 438/238; 438/239; 438/243; 438/245; 438/248

(58) Field of Search ................................ 438/238, 239, 438/243, 245, 248

(56) References Cited

U.S. PATENT DOCUMENTS 6,518,146 B1 * 2/2003 Singh et al. ................. 438/427
2004/0238869 A1 * 12/2004 Chang et al. ................ 257/301
2005/0012131 A1 * 1/2005 Chen et al. .................. 257/301

* cited by examiner

*Primary Examiner*—W. David Coleman
*Assistant Examiner*—William M. Brewster
(74) *Attorney, Agent, or Firm*—Quintero Law Office

(57) ABSTRACT

A double corner rounding process for a partial vertical cell. A first corner rounding process is performed after etching the substrate to form a shallow trench for device isolation. A second corner rounding process is performed after forming shallow trench isolations (STIs) and exposing the corner of the substrate at the active areas in the memory cell array region.

23 Claims, 6 Drawing Sheets

CORNER ROUNDING PROCESS FOR PARTIAL VERTICAL TRANSISTOR

BACKGROUND OF THE INVENTION

1. Field of the Invention

The present invention relates to a semiconductor manufacturing process and in particular to a method of forming a dynamic random access memory (DRAM) comprising deep trench capacitors and partial vertical transistors.

2. Description of the Related Art

When manufacturing memory products such as trench-type DRAM, stacked-type DRAM and FLASH memory, in order to reduce the size of a chip, the conventional semiconductor process uses self-aligned contact (SAC) technology to define a reduced distance between two adjacent gate conductive structures.

A DRAM structure comprising a trench capacitor and a vertical transistor is shown in FIG. 1. A deep trench 18 is formed in a substrate 10 comprising silicon. A trench capacitor 14 is formed in the lower portion of the deep trench 18.

A diffusion region is formed in the substrate 10 between the trench capacitor 14 and the vertical transistor 16 as a buried strap 12. The buried strap 12 is formed by driving the dopant in an electric layer (not shown) into the substrate 100 during a thermal process.

The trench top oxide (TTO) 24 is deposited on the upper electrode to electrically isolate the trench capacitor 14 and the vertical transistor 16.

The vertical transistor 16 comprises a source 26, a drain 12, a gate oxide layer 28, and a gate layer 20. The gate layer 22 extends from the surface of the deep trench 18 to the substrate 100.

However, the corner 30 of the gate oxide layer 28 is usually thinner than the vertical sidewall of the deep trench 18 and the surface of the substrate 100 because of the different rate of oxidation. Thus, performance of the vertical transistor 16 is affected.

SUMMARY OF THE INVENTION

Accordingly, an object of the invention is to provide a double corner rounding process for a partial vertical cell to avoid unacceptably thin corners of the gate oxide layer.

To achieve the above objects, the present invention provides a double corner rounding process for a partial vertical cell. First, a substrate comprising a memory cell array region and a supporting region is provided. A first mask layer is formed on the substrate. A deep trench is formed in the first mask layer and the substrate in the memory cell region. A capacitor is formed in a lower portion of the deep trench. A first insulating layer is formed in the upper portion of the deep trench, with surface lower than that of the substrate. A second mask layer is formed in the deep trench, with a surface lower than that of the first mask layer. A photoresist layer is formed on the active areas of the substrate, such that a first portion of the substrate, covered by the photoresist layer, and a second portion of the substrate, not covered by the photoresist layer, are defined. Parts of the first mask layer not covered by the photoresist layer and the second portion of the substrate are removed until the surface of the second portion of the substrate is lower than that of the first mask layer. The photoresist layer and the second mask layer are removed. The edge of the first mask layer is then removed until the corner of the first portion of the substrate is exposed. A first rounding process is subsequently performed on the corner of the first portion of the substrate. A second insulating layer is conformally formed on the first mask layer, the first insulating layer, and the substrate. An insulating plug is formed on the second insulating layer, such that the surface of the insulating plug is substantially level with that of the second insulating layer on the substrate. The insulating plug, the second insulating layer, and the first mask layer in the memory cell array are removed to expose the corner of the first portion of the substrate. Finally, a second rounding process is performed on the corner of the substrate in the memory cell array region.

The first mask layer comprises stacked silicon oxide and silicon nitride layers. The second insulating layer comprises silicon nitride. As well, the insulating plug comprises silicon oxide formed by high density plasma chemical vapor deposition (HDP CVD).

The second mask layer is an organic anti-reflection coating layer.

Removal of the edge of the first mask layer is performed by anisotropic etching, employing etching solution comprising hydrogen fluoride (HF) and ethylene glycol (EG).

The first rounding process comprises oxidizing the corner and the sidewall of the first portion of the substrate to form a sacrificial oxide layer and removing the sacrificed oxide layer. Oxidization is performed by in-situ steam generation (ISSG).

The second rounding process is performed by employing an oxidation agent and a HF solution by turns. The oxidation agent comprises $H_2O_{2(aq)}$ and $HNO_{3(aq)}$.

Transistors are further formed on the active area in the memory cell array region and in the supporting region.

According to the present invention, the corner of the substrate of the active areas in the memory cell array region undergoes double rounding to increase the curvature radius, such that the thickness of the gate oxide layer following formation is substantially equal to that of the other regions of the gate oxide layer, resulting in improved transistor quality.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
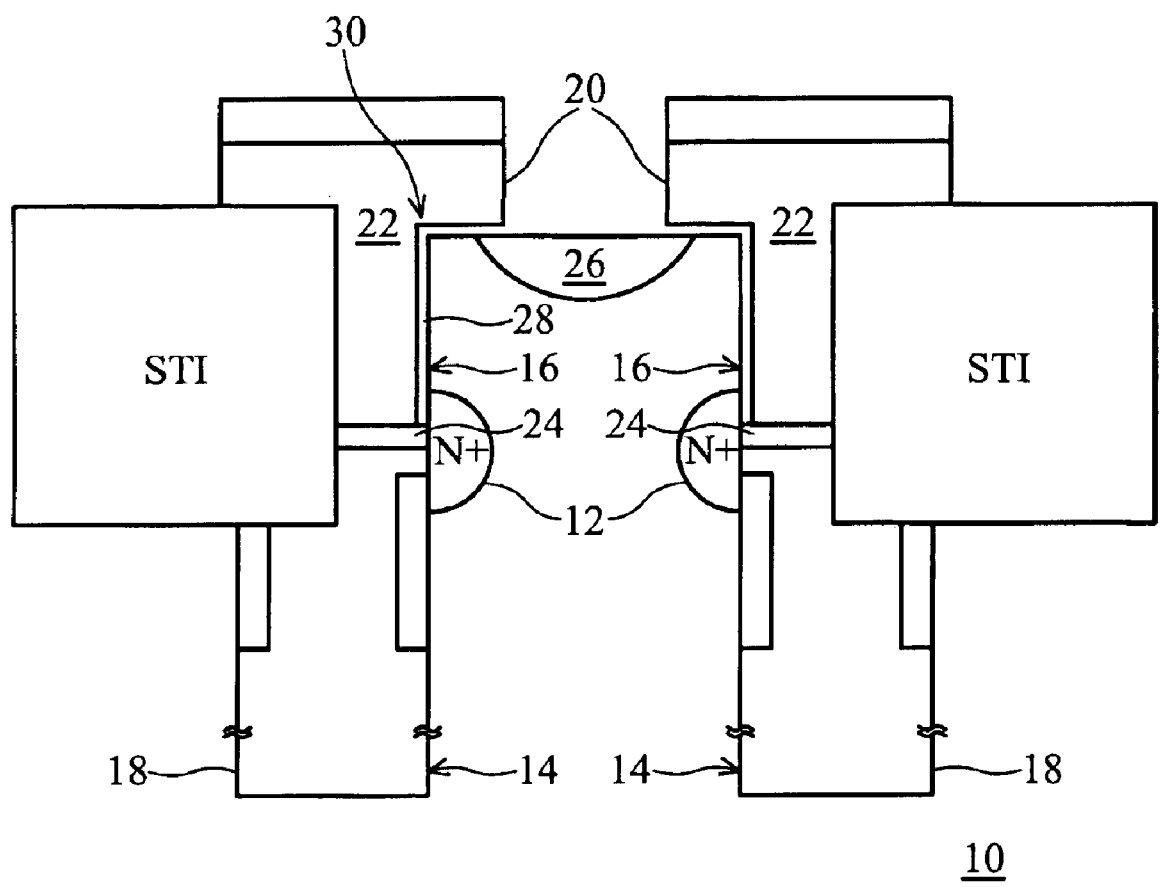
FIG. 1 is a cross-section of a conventional structure comprising a trench capacitor and a vertical transistor.
Figure 2A:
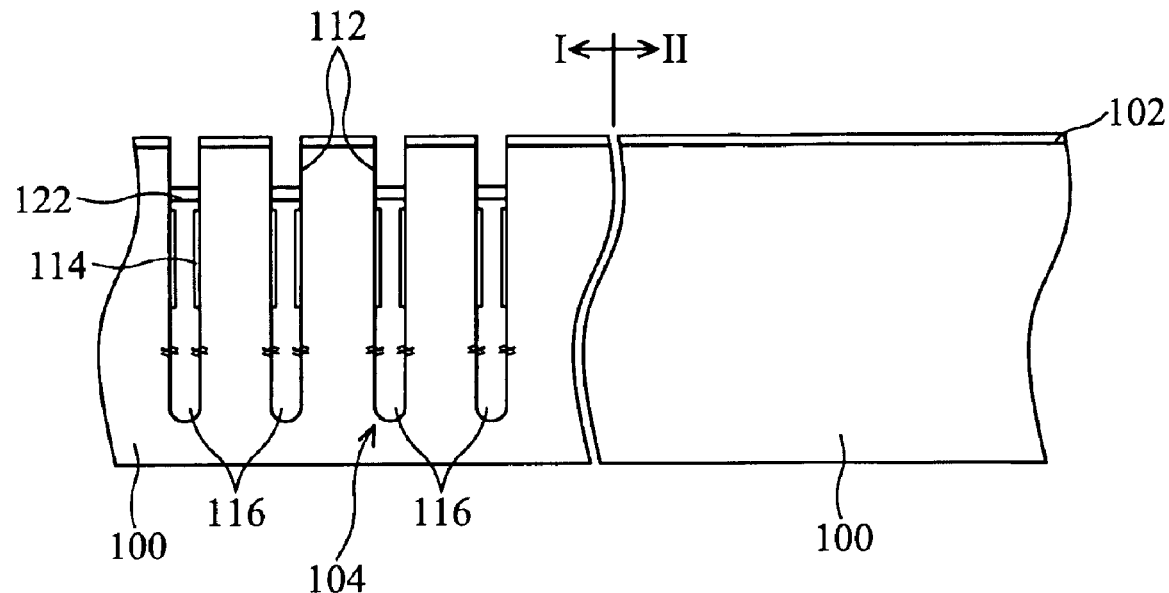
FIGS. 2A through 2I are cross-sections of a double corner rounding process for a partial vertical cell according to the invention.

In FIG. 2A, a substrate 100 comprising Si or Ge is provided. The substrate 100 is divided into two parts comprising a memory cell array region I and a supporting region II. A first mask layer 102 is formed on the substrate 100. The first mask layer 102 comprises stacked silicon oxide and silicon nitride layers.

Next, the first mask layer 102 is patterned. The substrate 100 undergoes photolithography and etching to form a deep trench 112 in the memory cell region I using the patterned first mask layer 102 as a shield. A capacitor 104 is formed in a lower portion of the deep trench 112. The trench capacitor 104 comprises a buried plate (BP) serving as a lower electrode, an upper electrode 116, a dielectric layer deposited between the upper electrode 116 and the lower electrode. The buried plate is deposited in the doped region of the substrate 100 surrounding the lower portion of the trench 112. The material of the electric layer 116 comprises silicon oxide or a stacked silicon oxide/silicon nitride/silicon oxide layer. The material of the upper electrode 116 comprises doped polysilicon.

A first insulating layer (collar) 114 is formed on the capacitor in the upper portion of the deep trench 112, with a surface lower than that of the substrate 100. A trench top oxide (TTO) 122 is subsequently formed on the first insulating 114 to isolate the upper electrode 116 and the following formed transistor. The trench top oxide 122 comprises tetraethlothosilicate (TEOS).

Figure 2B:
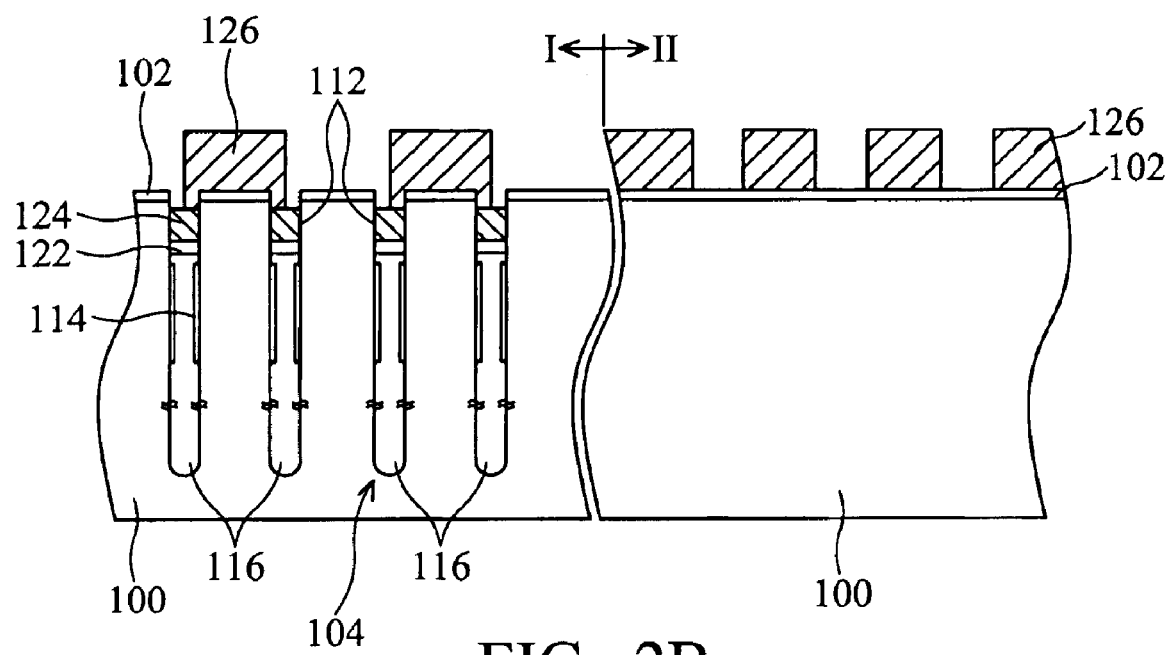

In FIG. 2B, a second mask layer 124 is formed in the deep trench 112, recessed below the first mask layer 102. The material of the second insulating layer 124 comprises an organic anti-reflection coating layer. A photoresist layer 126 is then formed on the active areas of the substrate 100 in the memory cell array region and in the supporting region.

Figure 2C:
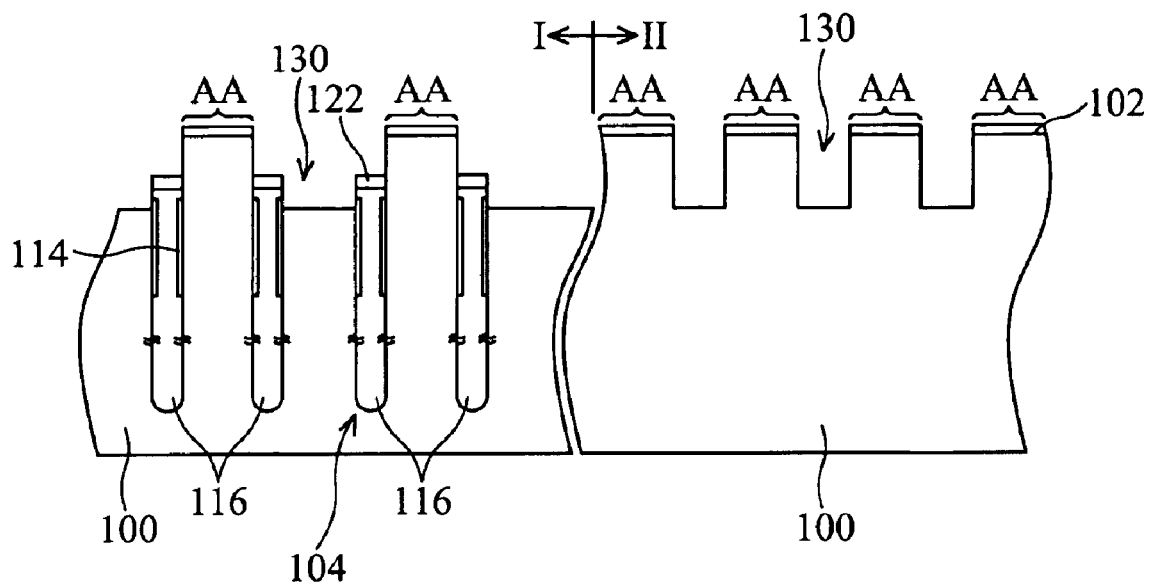

In FIG. 2C, using the photoresist layer 126 and the second mask layer 124 as a mask, the substrate 100 is etched to form a shallow trench 130 to define the active areas (AA), such that the surface of the trench 130 is lower than that of the trench top oxide 122. The photoresist layer 126 and the second mask layer 124 are subsequently removed.

Figure 2D:
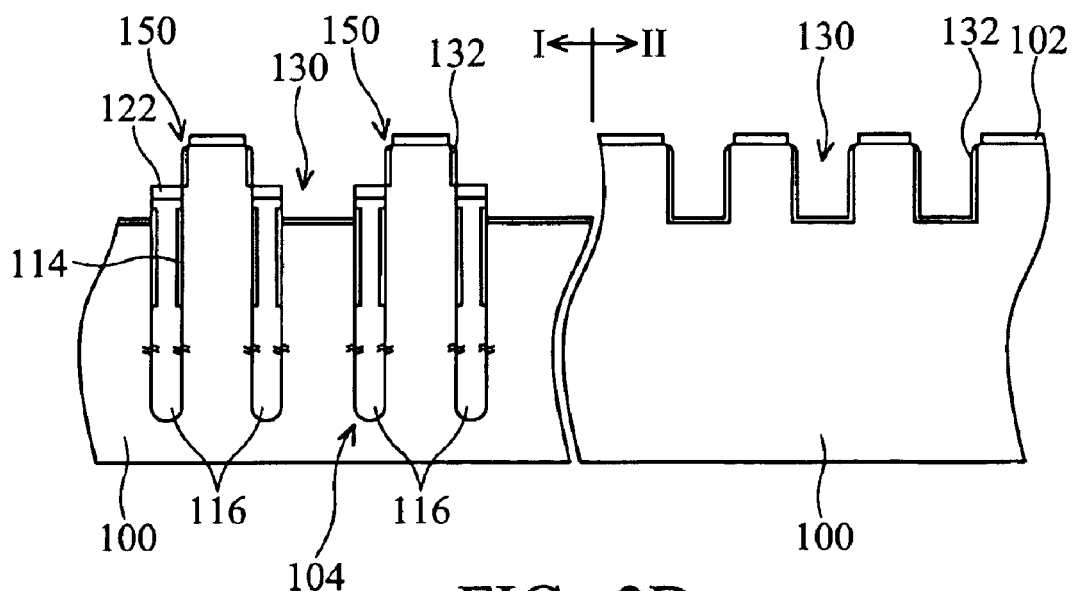

In FIG. 2D, the edge of the first mask layer 102 is then removed by anisotropic etching to expose the corner 150 of the substrate 100, employing an etching solution comprising hydrogen fluoride (HF) and ethylene glycol (EG).

A first rounding process is then performed on the corner 150 of the substrate 100 as follows. The corner 150 and the exposed sidewall of the substrate 100 undergo in-situ steam generation (ISSG) to form a sacrificial oxide layer 132, which is then removed. Thus, the rounded corner 150 of the substrate 100 in the active areas (AA) is obtained.

Figure 2E:
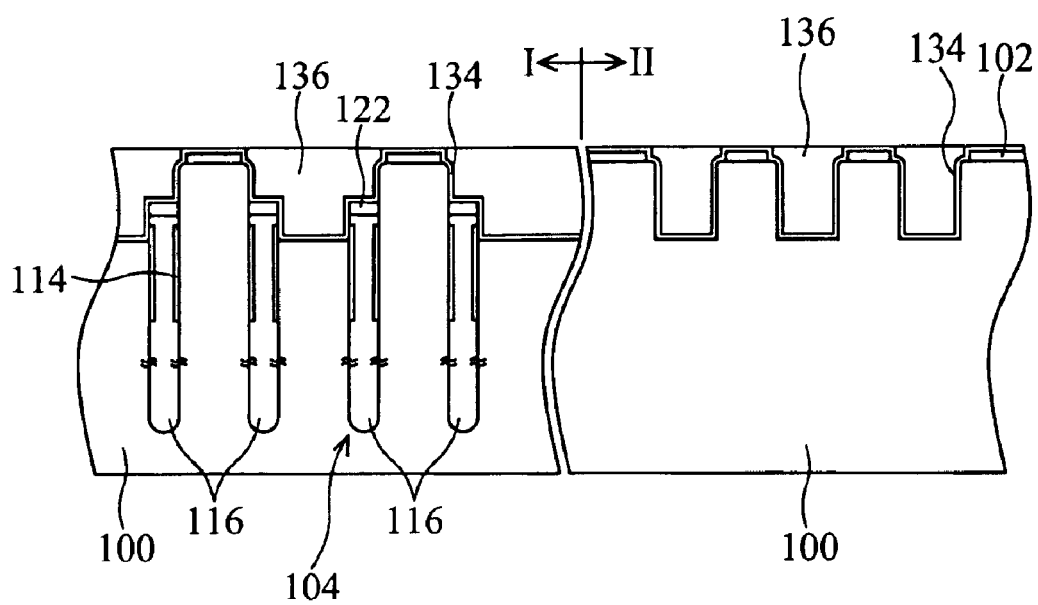

In FIG. 2E, a second insulating layer 134 comprising silicon nitride is conformally formed on the first mask layer 102, the first insulating layer 114, and the substrate 100. An insulating plug 136 is formed on the second insulating layer 134 by high density plasma chemical vapor deposition (HDP CVD). The insulating plug 136 undergoes chemical machine polishing (CMP) until the second insulating layer 134 is exposed, such that the surface of the insulating plug 136 is substantially level with that of the second insulating layer 134 on the substrate 100.

Figure 2F:
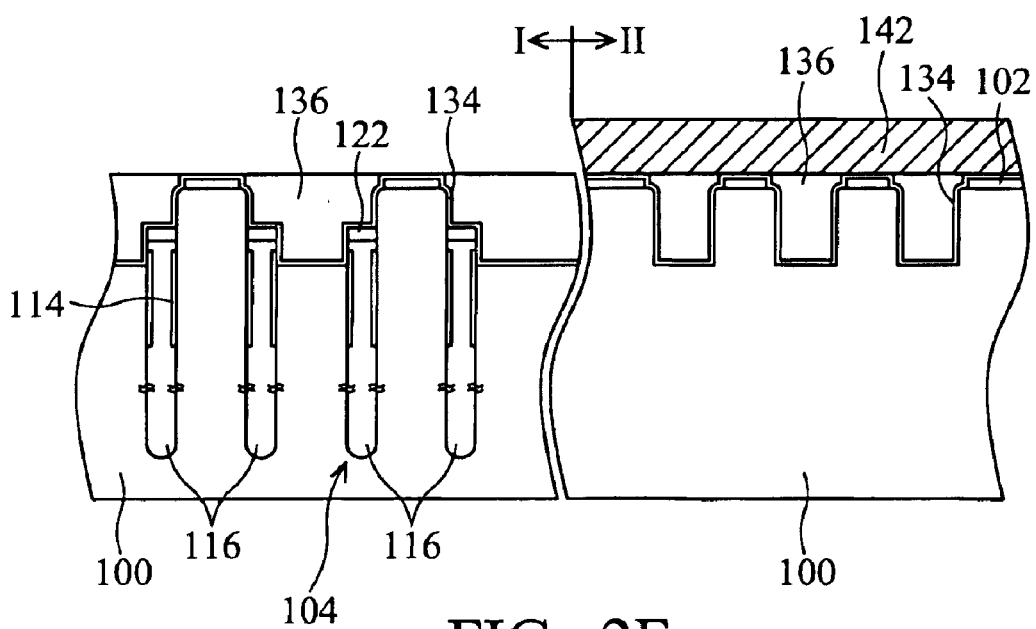

In FIG. 2F, a photoresist layer 142 is formed on the second insulating layer 134 and the insulating plug 136 in the supporting region II, such that memory cell array region I is exposed.

Figure 2G:
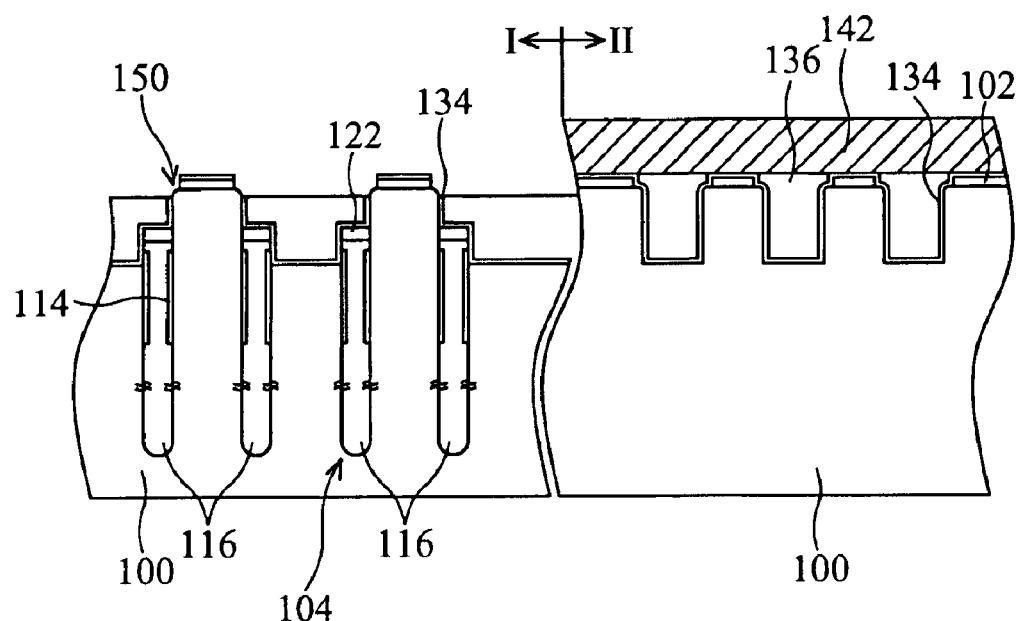

In FIG. 2G, the insulating plug 136, the second insulating layer 134, and the first mask layer 102 in the memory cell array I are removed to expose the corner 150 of the substrate 100 in the active areas (AA). A second rounding process is performed on the corner 150 of the substrate 100 in the memory cell array region I. $H_2O_2(aq)$ or $HNO_3(aq)$ is employed to form a sacrificial oxide layer on the corner 150. The sacrificed oxide layer is then removed by HF solution.

Figure 2H:
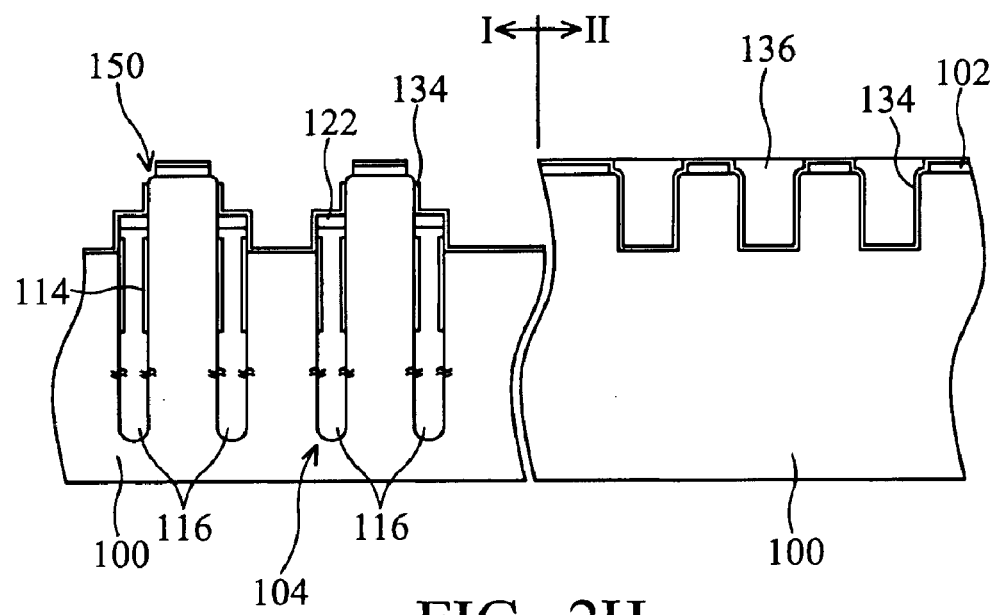
Figure 2I:
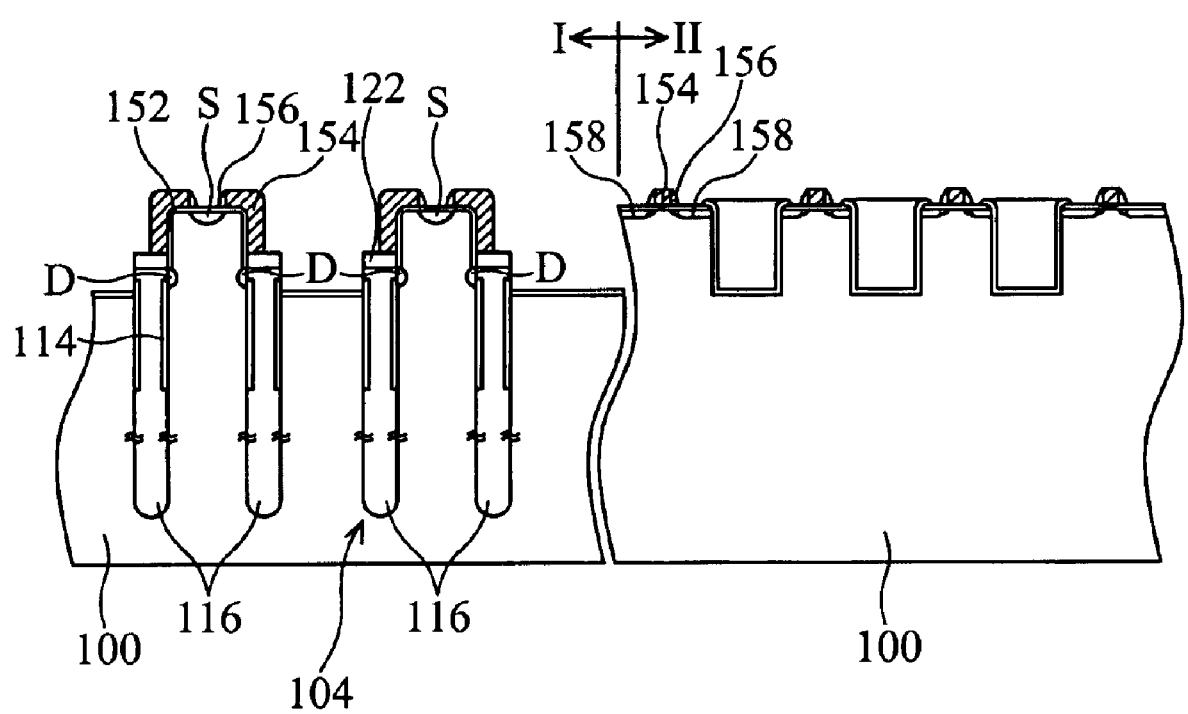

The insulating plug 136 in the memory cell array region I is removed using the photoresist layer 142 as a shield, as shown in FIG. 2H.

The second insulating layer 134 and the first mask layer 102 are subsequently removed to expose the substrate 100 in the active areas (AA). A gate oxide layer 152 comprising silicon oxide by oxidation formation is formed on the substrate 100. A gate layer 154 is formed on the gate oxide layer 152, and a spacer 156 is formed on the sidewall of the gate layer 152. Thus, transistors are obtained in the memory cell array region I and the supporting region II.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A double corner rounding process for a partial vertical cell, comprising:

providing a substrate comprising a memory cell array region and a supporting region and having a first mask layer thereon, wherein a deep trench is formed in the first mask layer and the substrate in the memory cell region, a capacitor is formed in a lower portion of the deep trench, a first insulating layer is formed in the upper portion of the deep trench, and the surface of the first insulating layer is lower than that of the substrate;

filling a second mask layer in the deep trench, wherein the surface of the second mask layer is lower than that of the first mask layer;

forming a photoresist layer on the active areas of the substrate, such that a first portion of the substrate, covered by the photoresist layer, and a second portion of the substrate, not covered by the photoresist layer, are defined;

removing parts of the first mask layer not covered by the photoresist layer and the second portion of the substrate until the surface of the second portion of the substrate is lower than that of the first mask layer;

removing the photoresist layer and the second mask layer;

removing the edge of the first mask layer until the corner of the first portion of the substrate is exposed;

performing a first rounding process on the corner of the first portion of the substrate;

conformally forming a second insulating layer on the first mask layer, the first insulating layer, and the substrate;

forming an insulating plug on the second insulating layer, such that the surface of the insulating plug is substantially level with that of the second insulating layer on the substrate;

removing the insulating plug, the second insulating layer, and the first mask layer from the memory cell array to expose the corner of the first portion of the substrate;

performing a second rounding process on the corner of the substrate in the memory cell array region.

2. The method as claimed in claim 1, wherein the first mask layer comprises stacked silicon oxide and silicon nitride layers.

3. The method as claimed in claim 1, wherein the second mask layer is an organic anti-reflection coating layer.

4. The method as claimed in claim 3, wherein removal of the edge of the first mask layer is performed by anisotropic etching.

5. The method as claimed in claim 4, wherein an etching solution comprising hydrogen fluoride (HF) and ethylene glycol (EG) is employed in anisotropic etching.

6. The method as claimed in claim 1, wherein the first rounding process comprises oxidizing the corner and the sidewall of the first portion of the substrate to form a sacrificial oxide layer and removing the sacrificed oxide layer.

7. The method as claimed in claim 6, wherein oxidization is performed by in-situ steam generation (ISSG).

8. The method as claimed in claim 1, wherein the second insulating layer comprises silicon nitride.

9. The method as claimed in claim 1, wherein the insulating plug comprises silicon oxide formed by high density plasma chemical vapor deposition (HDP CVD).

10. The method as claimed in claim 8, wherein the second rounding process is performed by employing an oxidation agent and a HF solution by turns.

11. The method as claimed in claim 10, wherein the oxidation agent comprises $H_2O_{2(aq)}$ and $HNO_{3(aq)}$.

12. The method as claimed in claim 1, further comprising forming transistors on the active area in the memory cell array region and in the supporting region.

13. A double corner rounding process for a partial vertical cell, comprising:
  providing a substrate comprising a memory cell array region and a supporting region and having a first mask layer thereon, wherein a deep trench is formed in the first mask layer and the substrate in the memory cell region, a capacitor is formed in a lower portion of the deep trench, a first insulating layer is formed in the upper portion of the deep trench, the surface of the first insulating layer is lower than that of the substrate, and a shallow trench is formed to define active areas in the memory cell array region and the supporting region;
  removing the edge of the first mask layer until the corner of the substrate is exposed;
  performing a first rounding on the corner of the substrate;
  conformally forming a second insulating layer on the first mask layer, the first insulating layer, and the substrate;
  forming an insulating plug on the second insulating layer, such that the surface of the insulating plug is substantially level with that of the second insulating layer on the substrate;
  removing the insulating plug, the second insulating layer, and the first mask layer from the memory cell array to expose the corner of the substrate in the memory cell array region;
  performing a second rounding process on the corner of the substrate in the memory cell array region.

14. The method as claimed in claim 13, wherein the first mask layer comprises stacked silicon oxide and silicon nitride layers.

15. The method as claimed in claim 13, wherein removal of the edge of the first mask layer is performed by anisotropic etching.

16. The method as claimed in claim 15, wherein an etching solution comprising hydrogen fluoride (HF) and ethylene glycol (EG) is employed in anisotropic etching.

17. The method as claimed in claim 13, wherein the first rounding process comprises oxidizing the corner and the sidewall of the first portion of the substrate to form a sacrificial oxide layer and removing the sacrificed oxide layer.

18. The method as claimed in claim 17, wherein oxidization is performed by in-situ steam generation (ISSG).

19. The method as claimed in claim 13, wherein the second insulating layer comprises silicon nitride.

20. The method as claimed in claim 1, wherein the insulating plug comprises silicon oxide formed by high density plasma chemical vapor deposition (HDP CVD).

21. The method as claimed in claim 13, wherein the second rounding process is performed by employing an oxidation agent and a HF solution by turns.

22. The method as claimed in claim 21, wherein the oxidation agent comprises $H_2O_{2(aq)}$ and $HNO_{3(aq)}$.

23. The method as claimed in claim 13, further comprising forming transistors on the active area in the memory cell array region and in the supporting region.

* * * * *